(12) United States Patent
Hanson et al.

(10) Patent No.: US 8,426,273 B2
(45) Date of Patent: Apr. 23, 2013

(54) METHODS OF FORMING FIELD EFFECT TRANSISTORS ON SUBSTRATES

(75) Inventors: Robert J. Hanson, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/969,418

(22) Filed: Dec. 15, 2010

(65) Prior Publication Data
US 2011/0086476 A1    Apr. 14, 2011

Related U.S. Application Data

(62) Division of application No. 11/215,477, filed on Aug. 30, 2005, now Pat. No. 7,867,851.

(51) Int. Cl.
*H01L 21/336* (2006.01)

(52) U.S. Cl.
USPC ..... 438/268; 438/270; 438/589; 257/E21.428

(58) Field of Classification Search ............... 438/268, 438/270, 197, 199, 589; 257/E21.428
See application file for complete search history.

(56) References Cited

U.S. PATENT DOCUMENTS

| | | | |
|---|---|---|---|
| 4,455,740 A | 6/1984 | Iwai | |
| 4,722,910 A | 2/1988 | Yasaitis | |
| 4,835,741 A | 5/1989 | Baglee | |
| 4,922,460 A | 5/1990 | Furutani et al. | |
| 4,931,409 A | 6/1990 | Nakajima et al. | |
| 4,937,641 A | 6/1990 | Sunami et al. | |
| 4,939,100 A | 7/1990 | Jeuch et al. | |
| 4,939,793 A | 7/1990 | Stewart | |
| 4,979,004 A | 12/1990 | Esquivel et al. | |
| 5,013,680 A | 5/1991 | Lowrey et al. | |
| 5,014,110 A | 5/1991 | Satoh | |
| 5,021,355 A | 6/1991 | Dhong et al. | |
| 5,047,117 A | 9/1991 | Roberts | |
| 5,107,459 A | 4/1992 | Chu et al. | |
| 5,108,938 A | 4/1992 | Solomon | |
| 5,122,848 A | 6/1992 | Lee et al. | |
| 5,160,491 A | 11/1992 | Mori | |

(Continued)

FOREIGN PATENT DOCUMENTS

| | | |
|---|---|---|
| DE | 04408764 | 9/1994 |
| DE | 19928781 | 7/2000 |

(Continued)

OTHER PUBLICATIONS

Barth, "ITRS commodity memory roadmap", IEEE Xplore, Jul. 28, 2003, Abstract.

(Continued)

*Primary Examiner* — Michael Trinh
(74) *Attorney, Agent, or Firm* — Wells St. John P.S.

(57) ABSTRACT

The invention includes methods of forming field effect transistors. In one implementation, the invention encompasses a method of forming a field effect transistor on a substrate, where the field effect transistor comprises a pair of conductively doped source/drain regions, a channel region received intermediate the pair of source/drain regions, and a transistor gate received operably proximate the channel region. Such implementation includes conducting a dopant activation anneal of the pair of source/drain regions prior to depositing material from which a conductive portion of the transistor gate is made. Other aspects and implementations are contemplated.

25 Claims, 10 Drawing Sheets

U.S. PATENT DOCUMENTS

| | | | |
|---|---|---|---|
| 5,244,824 A | 9/1993 | Sivan | |
| 5,254,218 A | 10/1993 | Roberts et al. | |
| 5,281,548 A | 1/1994 | Prall | |
| 5,358,879 A | 10/1994 | Brady et al. | |
| 5,371,024 A | 12/1994 | Hieda et al. | |
| 5,376,575 A | 12/1994 | Kim et al. | |
| 5,392,237 A | 2/1995 | Iida | |
| 5,413,949 A | 5/1995 | Hong | |
| 5,446,299 A | 8/1995 | Acovic et al. | |
| 5,467,305 A | 11/1995 | Bertin et al. | |
| 5,472,893 A | 12/1995 | Iida | |
| 5,480,838 A | 1/1996 | Mitsui | |
| 5,496,751 A * | 3/1996 | Wei et al. | 438/302 |
| 5,502,320 A | 3/1996 | Yamada et al. | |
| 5,504,357 A | 4/1996 | Kim et al. | |
| 5,512,770 A | 4/1996 | Hong | |
| 5,514,604 A * | 5/1996 | Brown | 438/270 |
| 5,532,089 A | 7/1996 | Adair et al. | |
| 5,567,634 A | 10/1996 | Hebert | |
| 5,573,837 A | 11/1996 | Roberts et al. | |
| 5,574,621 A | 11/1996 | Sakamoto et al. | |
| 5,612,559 A | 3/1997 | Park et al. | |
| 5,619,057 A | 4/1997 | Komatsu | |
| 5,687,119 A | 11/1997 | Park | |
| 5,693,549 A | 12/1997 | Kim | |
| 5,714,412 A | 2/1998 | Liang et al. | |
| 5,714,786 A | 2/1998 | Gonzalez et al. | |
| 5,739,066 A | 4/1998 | Pan | |
| 5,753,947 A | 5/1998 | Gonzalez | |
| 5,763,305 A | 6/1998 | Chao | |
| 5,792,687 A | 8/1998 | Jeng | |
| 5,792,690 A | 8/1998 | Sung | |
| 5,798,544 A | 8/1998 | Ohya et al. | |
| 5,817,552 A | 10/1998 | Roesner et al. | |
| 5,841,611 A | 11/1998 | Sakakima et al. | |
| 5,869,359 A | 2/1999 | Prabhakar | |
| 5,869,382 A | 2/1999 | Kubota | |
| 5,909,618 A | 6/1999 | Forbes et al. | |
| 5,963,469 A | 10/1999 | Forbes | |
| 5,964,750 A | 10/1999 | Tulleken et al. | |
| 5,972,754 A | 10/1999 | Ni et al. | |
| 5,977,579 A | 11/1999 | Noble | |
| 6,005,273 A | 12/1999 | Gonzalez et al. | |
| 6,015,990 A | 1/2000 | Hieda et al. | |
| 6,033,963 A * | 3/2000 | Huang et al. | 438/303 |
| 6,037,212 A | 3/2000 | Chao | |
| 6,054,355 A * | 4/2000 | Inumiya et al. | 438/296 |
| 6,059,553 A | 5/2000 | Jin et al. | |
| 6,063,669 A | 5/2000 | Takaishi | |
| 6,072,209 A | 6/2000 | Noble et al. | |
| 6,090,693 A | 7/2000 | Gonzalez et al. | |
| 6,090,700 A | 7/2000 | Tseng | |
| 6,096,596 A | 8/2000 | Gonzalez | |
| 6,108,191 A | 8/2000 | Bruchhaus et al. | |
| 6,114,735 A | 9/2000 | Batra et al. | |
| 6,120,952 A | 9/2000 | Pierrat et al. | |
| 6,124,611 A | 9/2000 | Mori | |
| 6,127,699 A | 10/2000 | Ni et al. | |
| 6,150,687 A | 11/2000 | Noble et al. | |
| 6,168,996 B1 | 1/2001 | Numazawa et al. | |
| 6,184,086 B1 | 2/2001 | Kao | |
| 6,187,643 B1 | 2/2001 | Borland | |
| 6,191,470 B1 | 2/2001 | Forbes et al. | |
| 6,214,670 B1 | 4/2001 | Shih et al. | |
| 6,215,149 B1 | 4/2001 | Lee et al. | |
| 6,225,669 B1 | 5/2001 | Long et al. | |
| 6,255,165 B1 | 7/2001 | Thurgate et al. | |
| 6,258,650 B1 | 7/2001 | Sunouchi | |
| 6,259,142 B1 | 7/2001 | Dawson et al. | |
| 6,274,497 B1 | 8/2001 | Lou | |
| 6,284,419 B2 | 9/2001 | Pierrat et al. | |
| 6,297,106 B1 | 10/2001 | Pan et al. | |
| 6,300,177 B1 | 10/2001 | Sundaresan et al. | |
| 6,303,518 B1 | 10/2001 | Tian et al. | |
| 6,306,755 B1 | 10/2001 | Zheng | |
| 6,319,644 B2 | 11/2001 | Pierrat et al. | |
| 6,323,506 B1 | 11/2001 | Alok | |
| 6,323,528 B1 | 11/2001 | Yamazaki et al. | |
| 6,331,461 B1 | 12/2001 | Juengling | |
| 6,337,497 B1 | 1/2002 | Hanafi et al. | |
| 6,340,614 B1 | 1/2002 | Tseng | |
| 6,348,385 B1 | 2/2002 | Cha et al. | |
| 6,349,052 B1 | 2/2002 | Hofmann et al. | |
| 6,362,506 B1 | 3/2002 | Miyai | |
| 6,372,554 B1 | 4/2002 | Kawakita et al. | |
| 6,383,861 B1 | 5/2002 | Gonzalez et al. | |
| 6,383,879 B1 | 5/2002 | Kizilyalli et al. | |
| 6,391,726 B1 | 5/2002 | Manning | |
| 6,399,490 B1 | 6/2002 | Jammy et al. | |
| 6,414,356 B1 | 7/2002 | Forbes et al. | |
| 6,417,085 B1 | 7/2002 | Batra et al. | |
| 6,420,786 B1 | 7/2002 | Gonzalez et al. | |
| 6,458,653 B1 | 10/2002 | Jang | |
| 6,458,925 B1 | 10/2002 | Fasano | |
| 6,459,138 B2 | 10/2002 | Reinberg | |
| 6,459,142 B1 | 10/2002 | Tihanyi | |
| 6,473,333 B1 | 10/2002 | Tachibana et al. | |
| 6,476,444 B1 | 11/2002 | Min | |
| 6,495,474 B1 | 12/2002 | Rafferty et al. | |
| 6,495,890 B1 | 12/2002 | Ono | |
| 6,498,062 B2 | 12/2002 | Durcan et al. | |
| 6,498,087 B2 | 12/2002 | French et al. | |
| 6,552,401 B1 | 4/2003 | Dennison | |
| 6,563,183 B1 | 5/2003 | En et al. | |
| 6,566,193 B2 | 5/2003 | Hofmann et al. | |
| 6,573,559 B2 | 6/2003 | Kitada et al. | |
| 6,586,808 B1 | 7/2003 | Xiang et al. | |
| 6,624,032 B2 | 9/2003 | Alavi et al. | |
| 6,630,720 B1 | 10/2003 | Maszara et al. | |
| 6,632,714 B2 | 10/2003 | Yoshikawa | |
| 6,632,723 B2 | 10/2003 | Watanabe et al. | |
| 6,645,818 B1 * | 11/2003 | Sing et al. | 438/275 |
| 6,645,869 B1 | 11/2003 | Chu et al. | |
| 6,656,748 B2 | 12/2003 | Hall et al. | |
| 6,696,746 B1 | 2/2004 | Farrar et al. | |
| 6,706,600 B2 | 3/2004 | Kanaya | |
| 6,707,706 B2 | 3/2004 | Nitayama et al. | |
| 6,717,200 B1 | 4/2004 | Schamberger et al. | |
| 6,720,232 B1 | 4/2004 | Tu et al. | |
| 6,724,028 B2 | 4/2004 | Gudesen | |
| 6,727,137 B2 | 4/2004 | Brown | |
| 6,744,097 B2 | 6/2004 | Yoo | |
| 6,753,228 B2 | 6/2004 | Azam et al. | |
| 6,767,789 B1 | 7/2004 | Bronner et al. | |
| 6,784,112 B2 | 8/2004 | Arita et al. | |
| 6,818,515 B1 | 11/2004 | Lee et al. | |
| 6,818,937 B2 | 11/2004 | Noble et al. | |
| 6,818,947 B2 | 11/2004 | Grebs et al. | |
| 6,822,261 B2 | 11/2004 | Yamazaki et al. | |
| 6,825,093 B2 | 11/2004 | Scholz | |
| 6,844,230 B2 | 1/2005 | Reinberg | |
| 6,844,591 B1 | 1/2005 | Tran | |
| 6,849,496 B2 | 2/2005 | Jaiprakash et al. | |
| 6,849,501 B2 | 2/2005 | Rudeck | |
| 6,864,536 B2 | 3/2005 | Lin et al. | |
| 6,888,198 B1 | 5/2005 | Krivokapic | |
| 6,888,770 B2 | 5/2005 | Ikehashi | |
| 6,897,109 B2 | 5/2005 | Jin et al. | |
| 6,916,711 B2 | 7/2005 | Yoo | |
| 6,924,190 B2 | 8/2005 | Dennison | |
| 6,930,640 B2 | 8/2005 | Chung et al. | |
| 6,939,763 B2 | 9/2005 | Schlosser et al. | |
| 6,969,662 B2 | 11/2005 | Fazan et al. | |
| 6,979,853 B2 | 12/2005 | Sommer et al. | |
| 7,005,349 B2 | 2/2006 | Lee et al. | |
| 7,005,710 B1 | 2/2006 | Gonzalez et al. | |
| 7,015,543 B2 * | 3/2006 | Kawamura et al. | 257/327 |
| 7,022,573 B2 | 4/2006 | Hsiao et al. | |
| 7,027,334 B2 | 4/2006 | Ikehashi et al. | |
| 7,030,436 B2 | 4/2006 | Forbes | |
| 7,042,009 B2 | 5/2006 | Shaheen et al. | |
| 7,049,196 B2 | 5/2006 | Noble | |
| 7,064,365 B2 | 6/2006 | An et al. | |
| 7,071,043 B2 | 7/2006 | Tang et al. | |
| 7,075,151 B2 | 7/2006 | Shino | |
| 7,084,028 B2 | 8/2006 | Fukuzumi | |
| 7,087,956 B2 | 8/2006 | Umebayashi | |

| | | |
|---|---|---|
| 7,091,092 B2 | 8/2006 | Sneelal et al. |
| 7,122,425 B2 | 10/2006 | Chance et al. |
| 7,122,449 B2 | 10/2006 | Langdo et al. |
| 7,125,774 B2 | 10/2006 | Kim et al. |
| 7,125,781 B2 | 10/2006 | Manning et al. |
| 7,135,371 B2 | 11/2006 | Han et al. |
| 7,148,527 B2 | 12/2006 | Kim et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,214,621 B2 | 5/2007 | Nejad et al. |
| 7,244,659 B2 | 7/2007 | Tang et al. |
| 7,250,650 B2 | 7/2007 | Hieriemann et al. |
| 7,262,089 B2 | 8/2007 | Abbott et al. |
| 7,282,401 B2 | 10/2007 | Juengling |
| 7,285,812 B2 | 10/2007 | Tang et al. |
| 7,319,255 B2 | 1/2008 | Hwang et al. |
| 7,349,232 B2 | 3/2008 | Wang et al. |
| 7,351,666 B2 | 4/2008 | Furukawa et al. |
| 7,361,545 B2 | 4/2008 | Li et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,494,870 B2 | 2/2009 | Chien et al. |
| 7,495,294 B2 | 2/2009 | Higashitani |
| 7,495,946 B2 | 2/2009 | Gruening-von Schwerin et al. |
| 7,504,686 B2 | 3/2009 | Lutze |
| 7,528,440 B2 | 5/2009 | Forbes |
| 7,535,745 B2 | 5/2009 | Shuto |
| 7,547,640 B2 | 6/2009 | Abatchev et al. |
| 7,547,945 B2 | 6/2009 | Tang et al. |
| 7,560,390 B2 | 7/2009 | Sant et al. |
| 7,564,087 B2 | 7/2009 | Forbes |
| 7,567,452 B2 | 7/2009 | Song et al. |
| 7,576,389 B2 | 8/2009 | Tanaka |
| 7,589,995 B2 | 9/2009 | Tang et al. |
| 7,602,001 B2 | 10/2009 | Gonzalez |
| 7,605,090 B2 | 10/2009 | Gutsche et al. |
| 7,608,503 B2 | 10/2009 | Lung et al. |
| 7,608,876 B2 | 10/2009 | Forbes |
| 7,619,311 B2 | 11/2009 | Lung |
| 7,648,919 B2 | 1/2010 | Tran et al. |
| 7,684,245 B2 | 3/2010 | Schumann et al. |
| 7,700,441 B2 | 4/2010 | Kim et al. |
| 7,732,275 B2 | 6/2010 | Orimoto et al. |
| 7,736,980 B2 | 6/2010 | Juengling |
| 7,755,132 B2 | 7/2010 | Mokhlesi |
| 7,759,193 B2 | 7/2010 | Fishburn |
| 7,902,028 B2 | 3/2011 | Kim et al. |
| 8,084,190 B2 | 12/2011 | Gutsche et al. |
| 2001/0002304 A1 | 5/2001 | Pierrat et al. |
| 2001/0017390 A1 | 8/2001 | Long et al. |
| 2001/0023045 A1 | 9/2001 | Pierrat et al. |
| 2001/0025973 A1 | 10/2001 | Yamada et al. |
| 2001/0038123 A1 | 11/2001 | Yu |
| 2001/0044181 A1 | 11/2001 | Nakamura |
| 2001/0052617 A1 | 12/2001 | Kitada et al. |
| 2002/0022339 A1 | 2/2002 | Kirchhoff |
| 2002/0127796 A1 | 9/2002 | Hofmann et al. |
| 2002/0127798 A1 | 9/2002 | Prall |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Cleventer et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0169629 A1 | 9/2003 | Goebel et al. |
| 2003/0170941 A1 | 9/2003 | Colavito |
| 2003/0170955 A1 | 9/2003 | Kawamura et al. |
| 2003/0234414 A1 | 12/2003 | Brown |
| 2004/0009644 A1 | 1/2004 | Suzuki |
| 2004/0018679 A1 | 1/2004 | Yu et al. |
| 2004/0034587 A1 | 2/2004 | Amberson et al. |
| 2004/0061148 A1 | 4/2004 | Hsu |
| 2004/0065919 A1* | 4/2004 | Wilson et al. .................. 257/329 |
| 2004/0070028 A1 | 4/2004 | Azam et al. |
| 2004/0092115 A1 | 5/2004 | Hsieh et al. |
| 2004/0125636 A1 | 7/2004 | Kurjanowicz et al. |
| 2004/0150070 A1 | 8/2004 | Okada et al. |
| 2004/0159857 A1 | 8/2004 | Horita et al. |
| 2004/0184298 A1 | 9/2004 | Takahashi et al. |
| 2004/0188738 A1 | 9/2004 | Farnworth et al. |
| 2004/0197995 A1 | 10/2004 | Lee et al. |
| 2004/0222458 A1 | 11/2004 | Hsich et al. |
| 2004/0224476 A1 | 11/2004 | Yamada et al. |
| 2004/0232466 A1 | 11/2004 | Birner et al. |
| 2004/0259311 A1 | 12/2004 | Kim et al. |
| 2004/0266081 A1* | 12/2004 | Oh et al. ....................... 438/197 |
| 2005/0017240 A1 | 1/2005 | Fazan |
| 2005/0042833 A1 | 2/2005 | Park et al. |
| 2005/0063224 A1 | 3/2005 | Fazan et al. |
| 2005/0066892 A1 | 3/2005 | Dip et al. |
| 2005/0104156 A1 | 5/2005 | Wasshuber |
| 2005/0106820 A1 | 5/2005 | Tran |
| 2005/0106838 A1 | 5/2005 | Lim et al. |
| 2005/0124130 A1 | 6/2005 | Mathew et al. |
| 2005/0136616 A1 | 6/2005 | Cho et al. |
| 2005/0158949 A1 | 7/2005 | Manning |
| 2005/0167751 A1 | 8/2005 | Nakajima et al. |
| 2005/0275014 A1 | 12/2005 | Kim |
| 2005/0275042 A1 | 12/2005 | Hwang et al. |
| 2005/0287780 A1 | 12/2005 | Manning et al. |
| 2006/0043449 A1 | 3/2006 | Tang et al. |
| 2006/0046407 A1 | 3/2006 | Juengling |
| 2006/0046424 A1 | 3/2006 | Chance et al. |
| 2006/0083058 A1 | 4/2006 | Ohsawa |
| 2006/0113588 A1 | 6/2006 | Wu |
| 2006/0160294 A1 | 7/2006 | Divakaruni et al. |
| 2006/0194410 A1 | 8/2006 | Sugaya |
| 2006/0204898 A1 | 9/2006 | Gutsche et al. |
| 2006/0216894 A1 | 9/2006 | Parekh et al. |
| 2006/0216922 A1 | 9/2006 | Tran et al. |
| 2006/0261393 A1 | 11/2006 | Tang et al. |
| 2006/0264001 A1 | 11/2006 | Tran et al. |
| 2007/0001222 A1 | 1/2007 | Orlowski et al. |
| 2007/0045712 A1 | 3/2007 | Haller et al. |
| 2007/0048941 A1 | 3/2007 | Tang et al. |
| 2007/0048942 A1 | 3/2007 | Hanson et al. |
| 2007/0051997 A1 | 3/2007 | Haller et al. |
| 2007/0096204 A1 | 5/2007 | Shiratake |
| 2007/0117310 A1 | 5/2007 | Bai et al. |
| 2007/0128856 A1 | 6/2007 | Tran et al. |
| 2007/0138526 A1 | 6/2007 | Tran et al. |
| 2007/0148984 A1 | 6/2007 | Abatchev et al. |
| 2007/0158719 A1 | 7/2007 | Wang |
| 2007/0166920 A1 | 7/2007 | Tang et al. |
| 2007/0178641 A1 | 8/2007 | Kim et al. |
| 2007/0238299 A1 | 10/2007 | Niroomand et al. |
| 2007/0238308 A1 | 10/2007 | Niroomand et al. |
| 2007/0261016 A1 | 11/2007 | Sandhu et al. |
| 2008/0012056 A1 | 1/2008 | Gonzalez |
| 2008/0012070 A1 | 1/2008 | Juengling |
| 2008/0042179 A1 | 2/2008 | Haller et al. |
| 2008/0061346 A1 | 3/2008 | Tang et al. |
| 2008/0099847 A1 | 5/2008 | Tang et al. |
| 2008/0142882 A1 | 6/2008 | Tang et al. |
| 2008/0166856 A1 | 7/2008 | Parekh et al. |
| 2008/0299774 A1 | 12/2008 | Sandhu et al. |
| 2008/0311719 A1 | 12/2008 | Tang et al. |
| 2009/0035655 A1 | 2/2009 | Gambut-Garel et al. |
| 2009/0173994 A1 | 7/2009 | Min et al. |

| | | | |
|---|---|---|---|
| 2009/0311845 A1 | 12/2009 | Tang et al. | |
| 2010/0006983 A1 | 1/2010 | Gutsche et al. | |
| 2012/0009772 A1 | 1/2012 | Mathew et al. | |

FOREIGN PATENT DOCUMENTS

| | | |
|---|---|---|
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| EP | 1125167 | 5/2010 |
| EP | 100114743 | 7/2011 |
| JP | 51-147280 | 12/1976 |
| JP | 58-220464 | 12/1983 |
| JP | 2002172 | 1/1990 |
| JP | 03-219677 | 9/1991 |
| JP | 04-014253 | 1/1992 |
| JP | 07-078977 | 3/1995 |
| JP | 07-106435 | 4/1995 |
| JP | 07-297297 | 11/1995 |
| JP | 09-129837 | 5/1997 |
| JP | 11-274478 | 10/1999 |
| JP | 2000-208762 | 7/2000 |
| JP | 2001-024161 | 1/2001 |
| JP | 2002-151654 | 5/2002 |
| JP | 2002-184958 | 6/2002 |
| JP | 2003-017585 | 1/2003 |
| JP | 2004-071935 | 3/2004 |
| JP | 2004-247656 | 9/2004 |
| JP | 2005-142203 | 6/2005 |
| JP | 2005-175090 | 6/2005 |
| JP | 2005-277430 | 6/2005 |
| JP | 2005-093808 | 7/2005 |
| JP | 2005-3554069 | 12/2005 |
| KR | 19930006930 | 4/1993 |
| KR | 19940006679 | 4/1994 |
| KR | 10-2004/0109280 | 10/2006 |
| KR | 10-0640616 | 10/2006 |
| TW | 428308 | 4/2001 |
| TW | 574746 | 2/2004 |
| TW | 200411832 | 7/2004 |
| TW | I231042 | 4/2005 |
| TW | I235479 | 7/2005 |
| TW | 200617957 | 6/2006 |
| WO | WO8603341 | 6/1986 |
| WO | WO9744826 | 11/1997 |
| WO | WO 99/36961 | 7/1999 |
| WO | WO 00/19272 | 4/2000 |
| WO | WO02089182 | 11/2002 |
| WO | WO 2005/024936 | 3/2005 |
| WO | WO2005083770 | 9/2005 |
| WO | PCT/US2006/008295 | 8/2006 |
| WO | PCT/US2004/034587 | 10/2006 |
| WO | PCT/US2005/030668 | 10/2006 |
| WO | PCT/US2006/031555 | 12/2006 |
| WO | WO 2007/058840 | 5/2007 |
| WO | PCT/US2007/001953 | 9/2007 |
| WO | PCT/US2007/014689 | 1/2008 |
| WO | PCT/US2007/016573 | 1/2008 |
| WO | PCT/US2007/014689 | 4/2008 |
| WO | PCT/US2007/001953 | 8/2008 |
| WO | PCT/US2007/014689 | 1/2009 |
| WO | PCT/US2007/016573 | 2/2009 |
| WO | PCT/US2007/019592 | 3/2009 |
| WO | PCT/US2007/023767 | 5/2009 |
| WO | PCT/US2006/031555 | 10/2011 |

OTHER PUBLICATIONS

Bashir et al., "Characterization of sidewall defects in selective epitaxial growth of silicon", American Vacuum Society, May/Jun. 1995, pp. 923-927.

Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.

Bernstein et al., Chapter 3, 3.4-3.5, SOI Device Electrical Properties, pp. 34-53.

Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.

Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).

Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" Jpn. J. Appl. Phys., vol. 42, pp. 2073-2076 (2003).

Clarke, "Device Structures Architectures compatible with conventional silicon processes—Vertical transistors plumbed for memory, logic", Electronic Engineering Times, p. 24, Feb. 14, 2000.

Fazan et al., "MOSFET design simplifies DRAM", EE Times, May 13, 2002, pp. 1-4.

Gonzalez et al., "A dynamic source-drain extension MOSFET using a separately biased conductive spacer", Solid-State Electronics, vol. 46, pp. 1525-1530 (2002).

Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.

Hara, "Toshiba cuts capacitor from DRAM cell design", EE Times, Feb. 7, 2002, pp. 1-3.

Henkels et al., "Large-Signal 2T, 1C DRAM Cell: Signal and Layout Analysis", 1994 IEEE Journal of Solid-State Circuits, Jul. 29, 1994, No. 7, pp. 829-832.

Keast, et al., "Silicon Contact Formation and Photoresist Planarization Using Chemical Mechanical Polishing", 1994 ISMIC, Jun. 7-8, 1994 VMIC Conference, pp. 204-205.

Kim et al., "The Breakthrough in data retention time of DRAM using Recess-Channel-Array Transistor (RCAT) for 88nm feature size and beyond", 2003 Symposium on VLSI Technology Digest of Technical Papers, 2 pages.

Kim H.S. et al., "An Outstanding and Highly Manufacturable 80nm DRAM Technology", 2003 IEEE, 4 pages.

Kuo et al., "A Capacitorless Double-Gate DRAM Cell Design for High Density Applications", IEEE, IEDM, pp. 843-846 (2002).

Lammers, "Bell Labs opens gate to deeper-submicron CMOS", Electronic Engineering Times, Dec. 6, 1999, p. 18.

Liu, "Dual-Work-Function Metal Gates by Full Silicidation of Poly-Si with Co-Ni Bi-Layers", 2005 IEEE, vol. 26, No. 4, Apr. 2005, pp. 228-230.

Lusky et al., "Investigation of Channel Hot Electron Injection by Localized Charge-Trapping Nonvolatile Memory Devices", IEEE Transactions on Electron Devices, vol. 51, No. 3, pp. 444-451 (Mar. 2004).

Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.

Minami et al., "A Floating Body Cell (FBC) Fully Compatible with 90nm CMOS Technology (CMOS IV) for 128Mb SOI DRAM", IEEE, 2005, 4 pages.

Minami et al., "A High Speed and High Reliability MOSFET Utilizing an Auxiliary Gate", 1990 Symposium on VLSI Technology, IEEE, pp. 41-42 (1990).

Mo et al., "Formation and Properties of ternary silicide (CoxNi1-x)Si2 thin films", 1998 IEEE, pp. 271-274.

Ranica et al., "A One Transistor Cell on Bulk Substrate (1T-Bulk) for Low-Cost and High Density eDRAM", 2004 Symposium on VLSI Technology Digest of Technical Papers, pp. 128-129.

Risch et al., "Vertical MOS Transistors wtih 70nm Channel Length", 1996 IEEE vol. 43, No. 9, Sep. 1996, pp. 1495-1498.

Sivagnaname et al., "Stand-by Current in PD-SOI Pseudo-nMOS Circuits", 2003 IEEE, pp. 95-96.

Sunouchi et al., "Double LDD Concave (DLC) Structure for Sub-Half Micron MOSFET", IEEE, IEDM, pp. 226-228 (1988).

Tanaka et al., "Scalability Study on a Capacitorless 1T-DRAM: From Single-gate PD-SOI to Double-gate FinDRAM", IEEE, 2004, pp. 37.5.1-37.5.4.

Tiwari et al., "Straddle Gate Transistors: High Ion/Ioff Transistors at Short Gate Lengths", IBM Research Article, pp. 26-27 (pre-Mar. 2006).

Villaret, "Mechanisms of charge modulation in the floating body of triple-well nMOSFET capacitor-less DRAMs", Microelectronic Engineering 72, 2004, pp. 434-439.

Wang et al., "Achieving Low junction capacitance on bulk SI MOSFET using SDOI process", Micron Technology, Inc., 12 pages.

Yoshida et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

Yoshida et al., "A Design of a Capacitorless 1T-DRAM Cell Using Gate-induced Drain Leakage (GIDL) Current for Low-power and High-speed Embedded Memory", 2003 IEEE, 4 pages.

WO PCT/US2004/0027898 Search Report, Feb. 18, 2005, Micron Technology, Inc.

WO PCT/US2004/0027898 Written Opini, Feb. 18, 2005, Micron Technology, Inc.

WO PCT/US2006/006806 IPER, Feb. 22, 2007, Micron Technology, Inc.

WO PCT/US2006/006806 Resp. to WO, Jan. 15, 2007, Micron Technology, Inc.

WO PCT/US2006/006806 Search Report, Jul. 12, 2006, Micron Technology, Inc.

WO PCT/US2006/006806 Written Opinio, Jul. 12, 2006, Micron Technology, Inc.

TW096128462 Search Report Trans., Jun. 1, 2011, Micron Technology, Inc.

Kraynik, "Foam Structure: From Soap Froth to Solid Foams", MRS Bulletin, Apr. 2003, pp. 275-278.

Yasaitis et al., "A Modular Process for Integrating Thick Polysilicon MEMS Devices with Submicron CMOS", Analog Devices, Pre-2004, pp. 1-10.

* cited by examiner

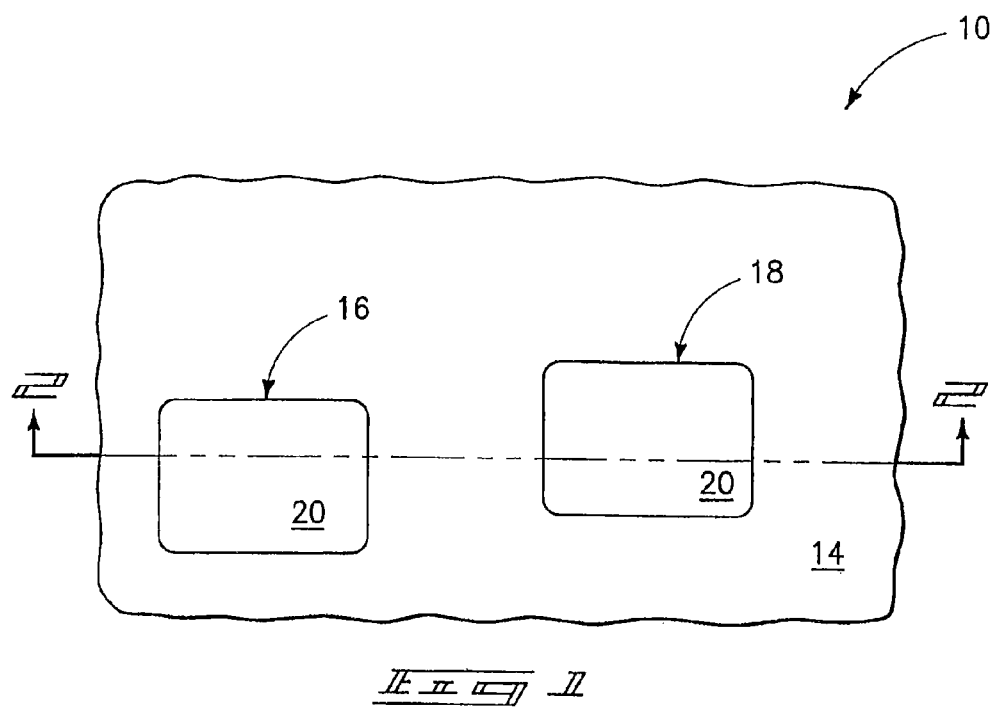
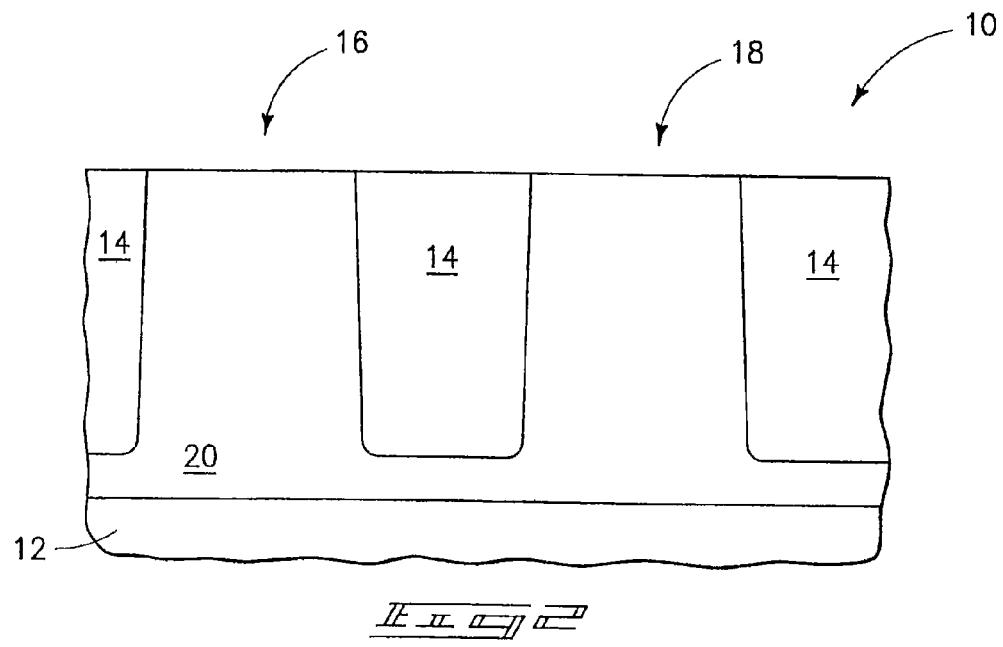

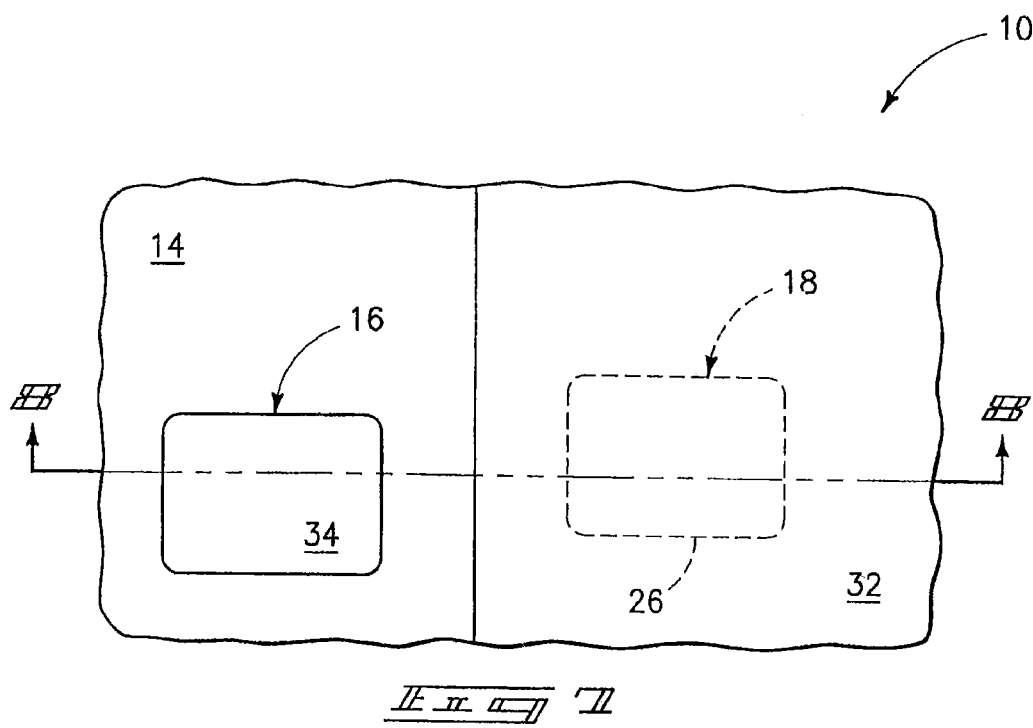
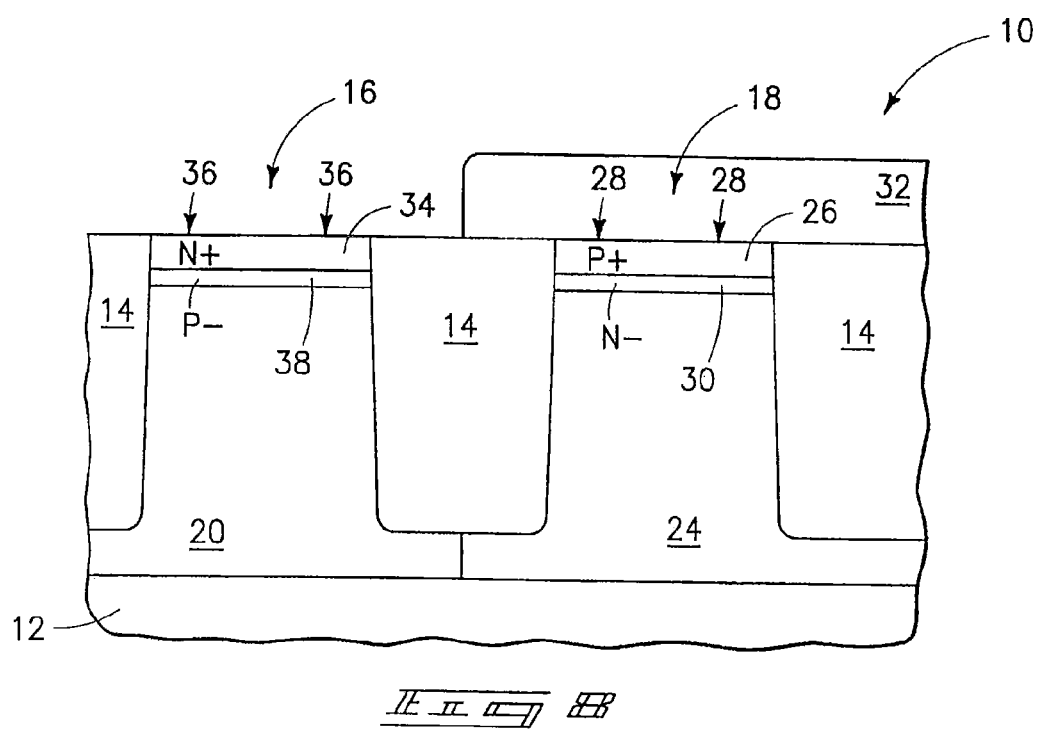

METHODS OF FORMING FIELD EFFECT TRANSISTORS ON SUBSTRATES

RELATED PATENT DATA

This application is a divisional of U.S. patent application Ser. No. 11/215,477, filed on Aug. 30, 2005, now U.S. Pat. No. 7,867,851, which is incorporated herein by reference.

TECHNICAL FIELD

This invention relates to methods of forming field effect transistors.

BACKGROUND OF THE INVENTION

A continuing goal in integrated circuitry design is to make ever denser, and therefore smaller, circuit devices. This results in thinner layers and smaller geometries. Further, new deposition techniques and materials are constantly being developed to enable circuit devices to be made smaller than the previous generations. Additionally, circuit design sometimes fabricates the devices to be substantially horizontally oriented relative to an underlying substrate, and sometimes substantially vertically oriented.

One common integrated circuit device is a field effect transistor. Such includes a pair of source/drain regions having a semiconductive channel region received operably therebetween. A conductive gate is received operably proximate the channel region, and is separated therefrom by a gate dielectric. Application of a suitable voltage potential to the gate enables current to flow between the source/drain regions through the channel region, with the transistor being capable of essentially functioning as a switch.

The source/drain regions of a field effect transistor typically include semiconductive material which has been doped with a conductivity enhancing impurity of a first and/or second conductivity type. Such dopant impurity might be intrinsically provided during the fabrication of the material from which the source/drain region is fabricated, or subsequently for example by suitable gas phase diffusion or ion implanting. The conductivity type (n or p) of the transistor is determined/designated by the conductivity type of highest dopant concentration portion of the source/drain regions. Specifically, p-channel or PMOS devices have their source/drain highest dopant concentration of p type, and n-channel or NMOS devices have their source/drain highest dopant concentration of n type.

Regardless, the dopants as initially provided are eventually subjected to a high temperature dopant activation anneal to impart desired and necessary operating characteristics to the source/drain regions. However, some present and future generation conductive gate materials are/will be comprised of elemental-form metals, alloys of elemental metals, and conductive metal compounds. Such materials can be adversely affected by the typical temperatures and times required to achieve dopant activation by anneal. For example, certain metal materials (i.e., titanium, titanium nitride, molybdenum silicide, nickel silicide, titanium silicide, and cobalt silicide) are thermally unstable and result in stress/strain induced stacking faults or react with the dielectric when subjected to the high temperature anneals typically required to achieve dopant activation.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming field effect transistors. In one implementation, the invention encompasses a method of forming a field effect transistor on a substrate, where the field effect transistor comprises a pair of conductively doped source/drain regions, a channel region received intermediate the pair of source/drain regions, and a transistor gate received operably proximate the channel region. Such implementation includes conducting a dopant activation anneal of the pair of source/drain regions prior to depositing material from which a conductive portion of the transistor gate is made.

In one implementation, a method of forming a field effect transistor includes ion implanting conductivity enhancing impurity dopant into semiconductive material of a substrate to form highest dopant concentration portions of a pair of source/drain regions. A dopant activation anneal is conducted of the highest dopant concentration portions of the pair of source/drain regions. After the dopant activation anneal, material is deposited from which a conductive portion of the transistor gate of the transistor is made.

In one implementation, a method of forming a field effect transistor includes ion implanting conductivity enhancing impurity dopant into an implant region of semiconductive material of a substrate to a highest dopant concentration for a pair of source/drain regions. After the ion implanting, a dopant activation anneal of the implant region is conducted. After the dopant activation anneal, an opening is etched through the implant region into semiconductive material of the substrate. Gate dielectric and conductive material of the transistor gate of the transistor are formed within the opening.

In one implementation, a method of forming an n-channel field effect transistor and a p-channel field effect transistor on a substrate includes ion implanting p-type conductivity enhancing impurity dopant into semiconductive material of a substrate to form highest dopant concentration portions of a pair of source/drain regions of the p-channel field effect transistor. Before or thereafter, n-type conductivity enhancing impurity dopant is ion implanted into semiconductive material of the substrate to form highest dopant concentration portions of the pair of source/drain regions of the n-channel field effect transistor. A dopant activation anneal is simultaneously conducted of the highest dopant concentration portions of the pair of source/drain regions of each of the n-channel field effect transistor and of the p-channel field effect transistor. After the dopant activation anneal, material is deposited from which conductive portions of the transistor gates of the transistors are made.

Other aspects and implementations are contemplated.

BRIEF DESCRIPTION OF THE DRAWINGS

Preferred embodiments of the invention are described below with reference to the following accompanying drawings.

FIG. 1 is a diagrammatic top plan view of a semiconductor substrate in process in accordance with an aspect of the invention.

FIG. 2 is a view of the FIG. 1 substrate taken through line 2-2 in FIG. 1.

FIG. 7 is a view of the FIG. 5 substrate at a processing subsequent to that depicted by FIG. 5.

FIG. 8 is a view of the FIG. 7 substrate taken through line 8-8 in FIG. 7.

DETAILED DESCRIPTION OF THE PREFERRED EMBODIMENTS

Figure 3:
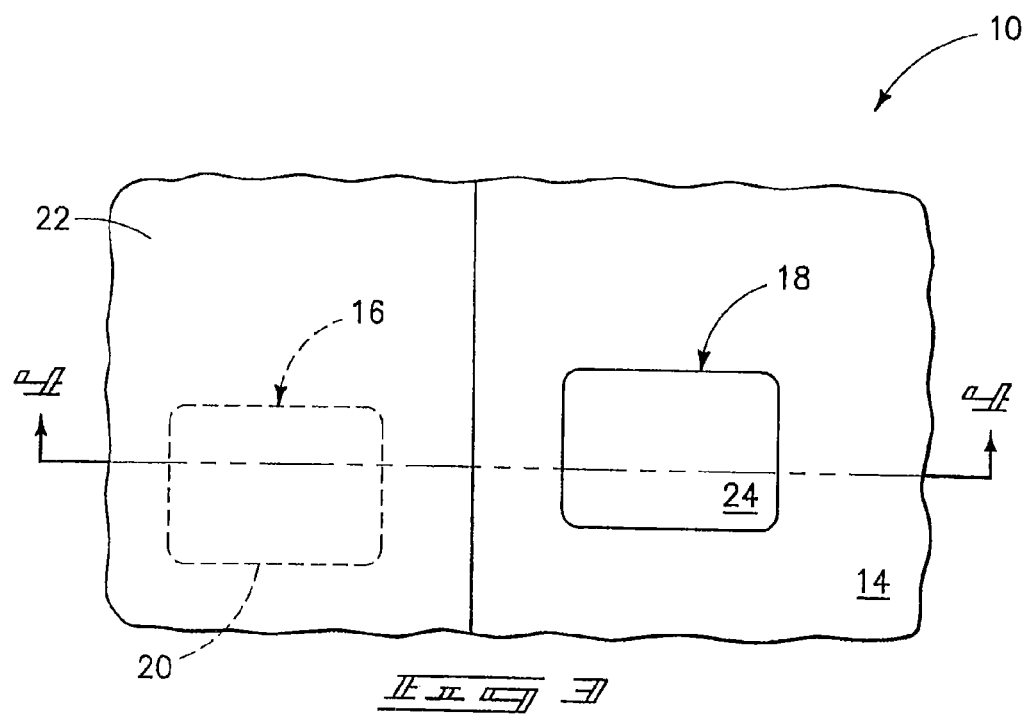
FIG. 3 is a view of the FIG. 1 substrate at a processing subsequent to that depicted by FIG. 1.

This disclosure of the invention is submitted in furtherance of the constitutional purposes of the U.S. Patent Laws "to promote the progress of science and useful arts" (Article 1, Section 8).

Exemplary preferred methods of forming a field effect transistor on a substrate are described with reference to FIGS. 1-20. By way of example only, the field effect transistor might be p-type or n-type. Regardless, the field effect transistor will comprise a pair of conductively doped source/drain regions, a channel region received intermediate the pair of source/drain regions, and a transistor gate received operably proximate the channel region. An exemplary preferred embodiment method is described in forming both an n-channel field effect transistor and a p-channel field effect transistor on a substrate, although methods in accordance with the invention might be utilized to fabricate only a single conductivity type field effect transistor.

Referring to FIGS. 1 and 2, an exemplary substrate fragment in process is indicated generally with reference numeral 10. Such preferably comprises a semiconductive substrate, with the depicted preferred example comprising bulk monocrystalline semiconductive material 12 (for example, silicon), although other substrates (for example, semiconductor-on-insulator substrates) are also contemplated. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Trench isolation material 14 has been formed relative to substrate 12, for example comprising one or a combination of silicon dioxide and silicon nitride. In the depicted example, semiconductive material 12 has been suitably background doped with p-type material (i.e., boron) to define a p-well 20 having a suitable dopant concentration to function as an NMOS channel. Trench isolation regions 14 have been fabricated to define an exemplary substrate area 16 in which an n-channel field effect transistor will be fabricated, and an area 18 in which a p-channel field effect transistor will be fabricated.

Figure 4:
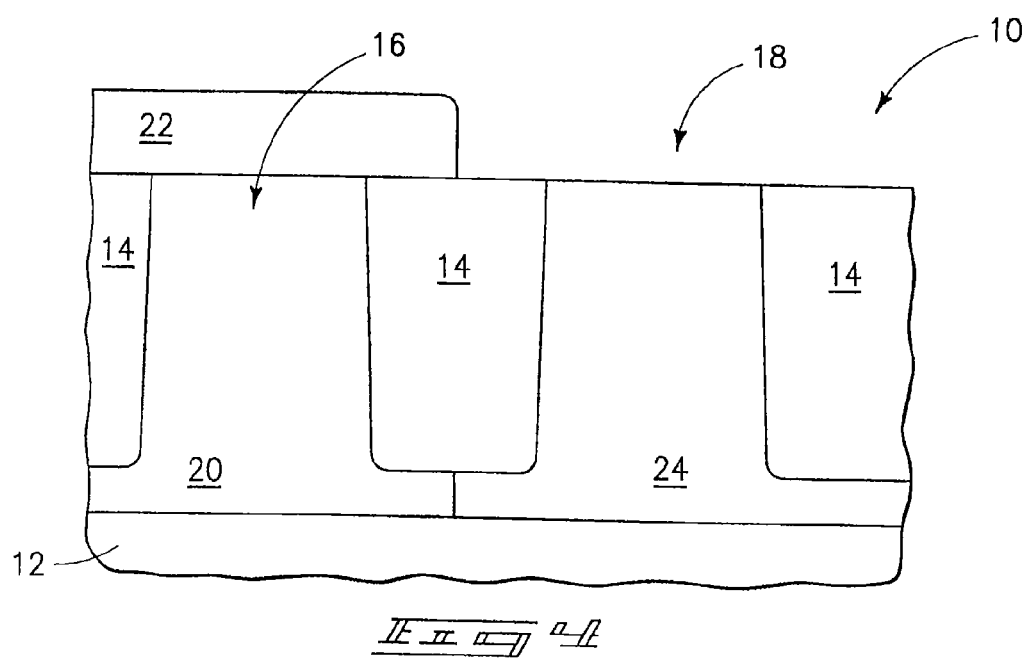
FIG. 4 is a view of the FIG. 3 substrate taken through line 4-4 in FIG. 3.

Referring to FIGS. 3 and 4, n-channel region/area 16 has been suitably masked, for example with a photoresist layer 22. Suitable background n-type doping has occurred to form an n-well region 24 within p-channel region/area 18.

Figure 5:
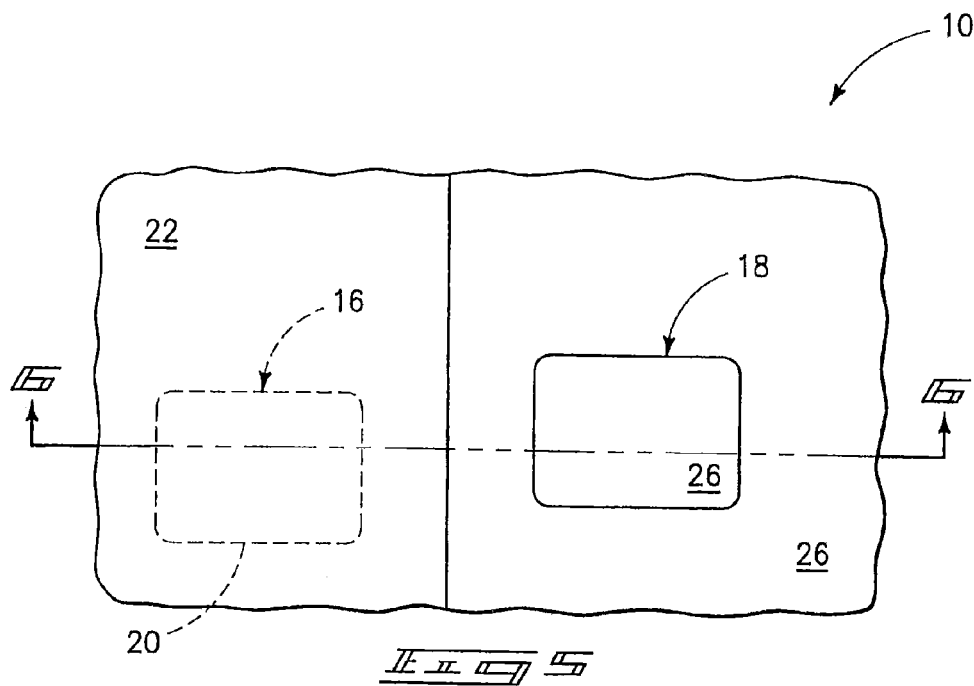
FIG. 5 is a view of the FIG. 3 substrate at a processing subsequent to that depicted by FIG. 3.
Figure 6:
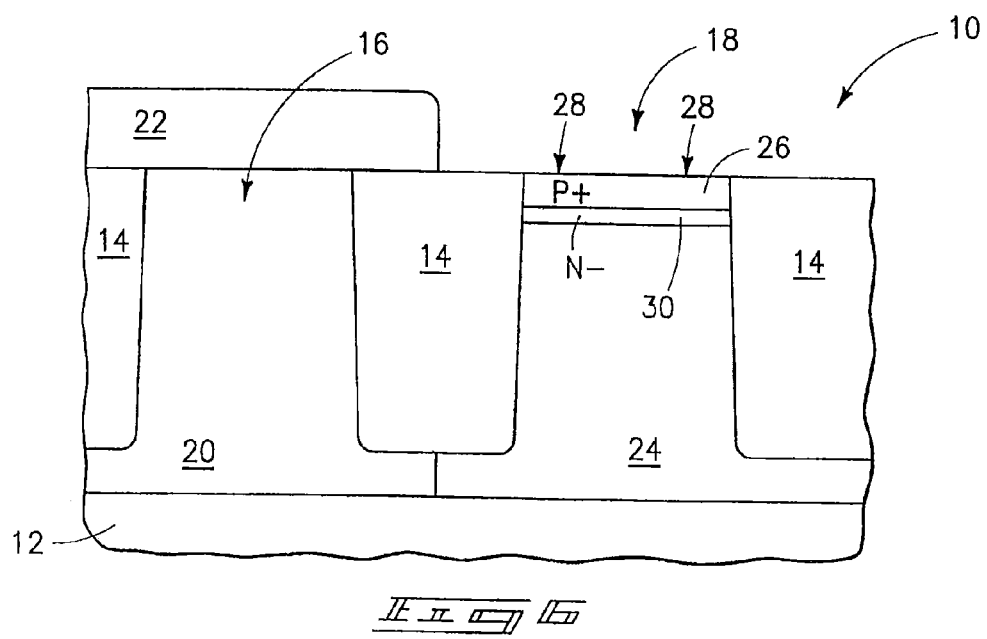
FIG. 6 is a view of the FIG. 5 substrate taken through line 6-6 in FIG. 5.

Referring to FIGS. 5 and 6, p-type conductivity enhancing impurity dopant has been ion implanted into a first region 26 of semiconductive material 24 of the substrate to a highest dopant concentration for the pair of source/drain regions of the p-channel field effect transistor being fabricated. An exemplary implant material is boron, for example deposited to an exemplary dopant concentration of from $1 \times 10^{13}$ ions/cm$^3$ to $1 \times 10^{16}$ ions/cm$^3$. An exemplary thickness of implanted first region 26 is from 300 Angstroms to 500 Angstroms, with an exemplary depth for peak implant concentration being from 200 Angstroms to 400 Angstroms. A conductivity enhancing impurity might be provided within first region 26 by any existing or yet-to-be developed manner, including those other than ion implanting, for example by gas phase diffusion. Regardless, in this exemplary embodiment, first region 26 will be fabricated to comprise a pair of source/drain regions 28 of the p-channel field effect transistor being fabricated, with region 26 constituting the highest dopant concentration portions thereof and as will become apparent from the continuing discussion. Accordingly, separate portions of first region 26 will constitute the highest dopant concentration portions of source/drain regions 28.

Further in one exemplary preferred embodiment, and as shown, aspects of the invention contemplate ion implanting a conductivity modifying impurity dopant into semiconductive material 24 of the substrate to form at least one lower dopant concentration portion 30 received proximate each highest dopant concentration portion of region 26 of each source/drain region 28. By way of example only, lower dopant concentration portion 30 is depicted as being received below first region 26. Further by way of example only, such region might comprise one or a combination of a threshold voltage ($V_t$) adjust implant and a lightly doped drain (LDD) implant. Such is depicted as comprising a $V_t$ adjust implant of opposite conductivity type to that of p+ region 26. An example dopant material comprises arsenic, for example implanted to concentration of from $1 \times 10^{12}$ ions/cm$^3$ to $1 \times 10^{13}$ ions/cm$^3$. Regardless, the lower dopant concentration portions formed proximate each highest dopant concentration portion of the field effect transistor might be of the same conductivity type as the highest dopant concentration portion, or of different conductivity types. Further if of the same conductivity type, the dopant of the lower dopant concentration portions and the dopant of the highest dopant concentration portions might be of the same or different compositions.

Referring to FIGS. 7 and 8, p-channel region/area 18 has been masked, for example with photoresist 32, and an n-type conductivity enhancing impurity dopant has been ion implanted into a second region 34 of semiconductive material 20 of the substrate to a highest dopant concentration for the pair of source/drain regions of the n-channel field effect transistor being fabricated. An exemplary dopant concentration is the same as that described above for first region 26. An exemplary suitable n-type implant material is arsenic, and exemplary preferred thickness and peak implant depth for second region 34 are the same as those for first region 26. A conductivity enhancing impurity might be provided within first region 26 by any existing or yet-to-be developed manner, including those other than ion implanting, for example by gas phase diffusion. Regardless, in this exemplary embodiment, second region 34 will be fabricated to comprise a pair of source/drain regions 36 of the n-channel field effect transistor being fabricated, with region 34 constituting the highest dopant concentration portions thereof and as will become apparent from the continuing discussion. Accordingly, separate portions of second region 34 will constitute the highest dopant concentration portions of source/drain regions 36.

FIGS. 7 and 8 also depict exemplary preferred ion implanting of a conductivity modifying impurity dopant into the semiconductive material of the substrate to form at least one lower dopant concentration portion 38 proximate each highest dopant concentration portion of region 34 of source/drain regions 36 being fabricated. As above, a preferred orientation for implant region 38 is lower in the semiconductive material than are the highest dopant concentration portions of region 34. Further as described above with connection to the relationship between first region 26 and lower dopant concentration region 30, lower dopant concentration portions of region 38 might be of the same conductivity type as those of the portions of region 34, or of different conductivity types. If of the same conductivity type, the dopants might be of the same composition or of different compositions. In the depicted example, region 38 is depicted as comprising a $V_t$ adjust implant of opposite conductivity type to that of n+ region 34. An example dopant material comprises boron, for example implanted to concentration of from $1 \times 10^{12}$ ions/cm$^3$ to $1 \times 10^{13}$ ions/cm$^3$.

The above exemplary orderings of masking and forming the respective p-type and n-type regions could of course be reversed.

Figure 9:
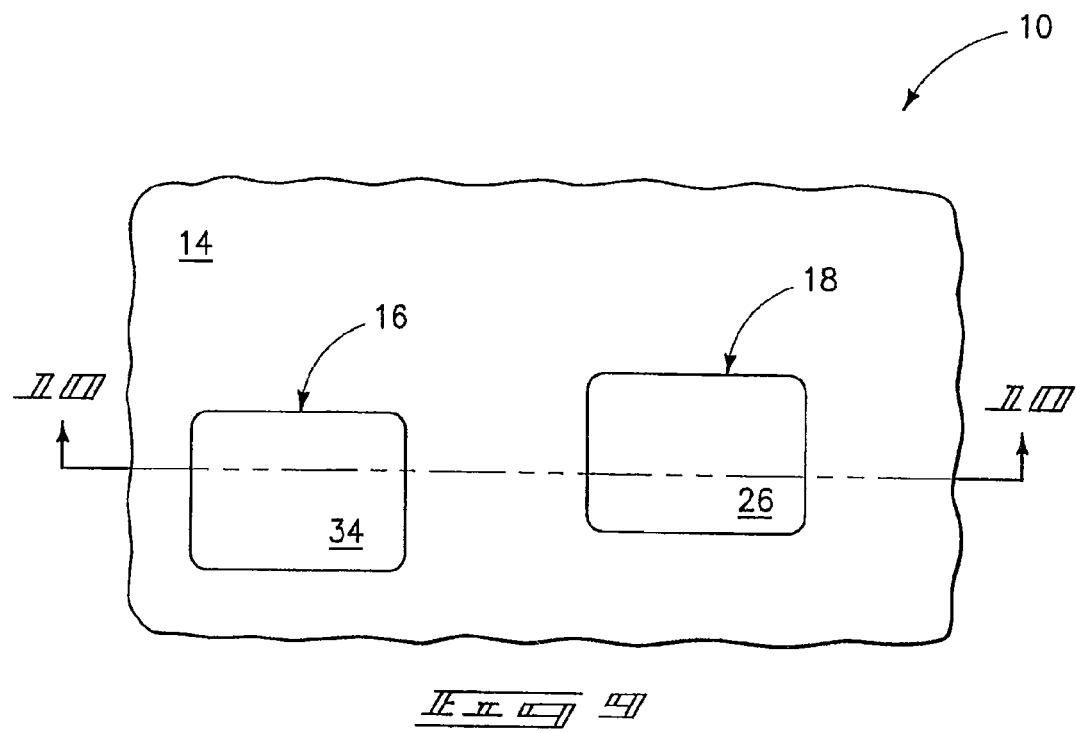
FIG. 9 is a view of the FIG. 7 substrate at a processing subsequent to that depicted by FIG. 7.
Figure 10:
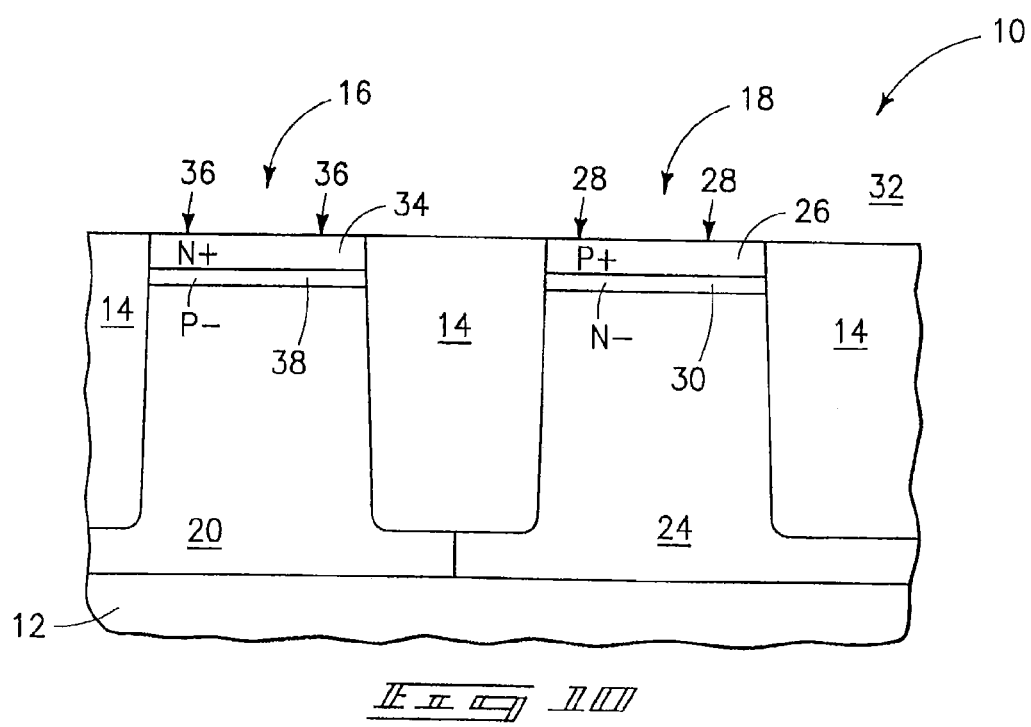
FIG. 10 is a view of the FIG. 9 substrate taken through line 10-10 in FIG. 9.

Referring to FIGS. 9 and 10, photoresist mask 32 (not shown) has been removed, and the substrate subjected to a dopant activation anneal to simultaneously activate the dopants in regions 16 and 18. Any existing or yet-to-be developed anneal technique effective for dopant activation where required is contemplated. By way of example only, one exemplary preferred technique includes exposing the substrate to rapid thermal processing (RTP) at a temperature of at least 920° C. for from 10 seconds to 90 seconds, or furnace anneal at a temperature of at least 600° C. for from 20 minutes to 60 minutes.

Figure 11:
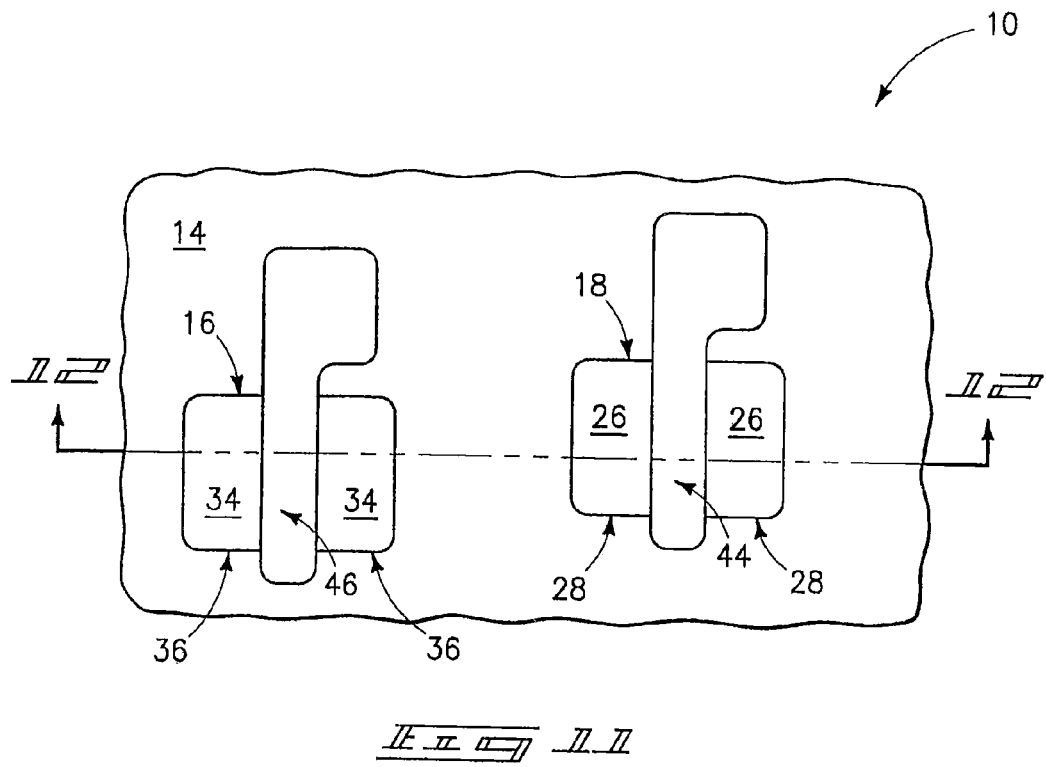
FIG. 11 is a view of the FIG. 9 substrate at a processing subsequent to that depicted by FIG. 9.
Figure 12:
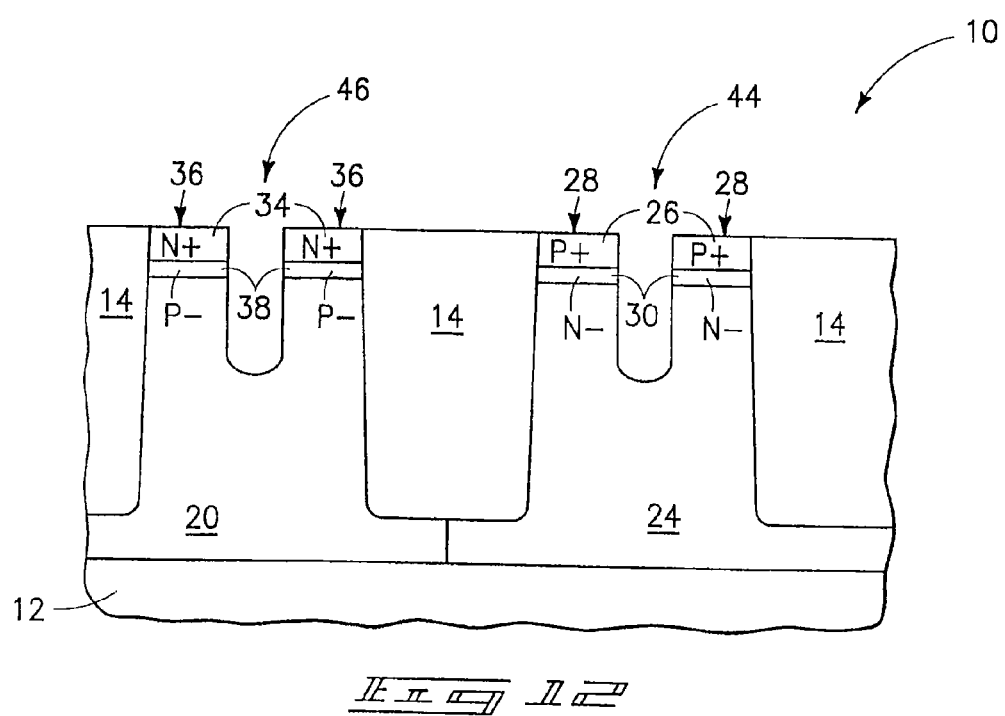
FIG. 12 is a view of the FIG. 11 substrate taken through line 12-12 in FIG. 11.

Referring to FIGS. 11 and 12, and after the dopant activation anneal, a first opening 44 has been etched through first region 26 (and also through lower dopant concentration portion 30 received therebeneath) into semiconductive material 24 of the substrate. Further, a second opening 46 has been etched through second region 34 (and also preferably through lower dopant concentration portion 38 received therebeneath) into semiconductive material 20 of the substrate. Such is preferably conducted simultaneously, for example utilizing one or more common masking and etching steps. Such is also depicted, by way of example only, as forming openings 44 and 46 to extend over and within trench isolation 14. In this exemplary embodiment, and by way of example only, desired field effect transistor gates will be formed within openings 44 and 46. Further, opening 44 is laterally centered relative to implant region 26 in at least one respective straight line cross-section of the substrate, for example the cross-section line 12-12 as shown in FIG. 11. Also, opening 46 is laterally centered relative to implant region 34 in at least one respective straight line cross-section of the substrate, for example the cross-section line 12-12 as shown in FIG. 11.

Figure 13:
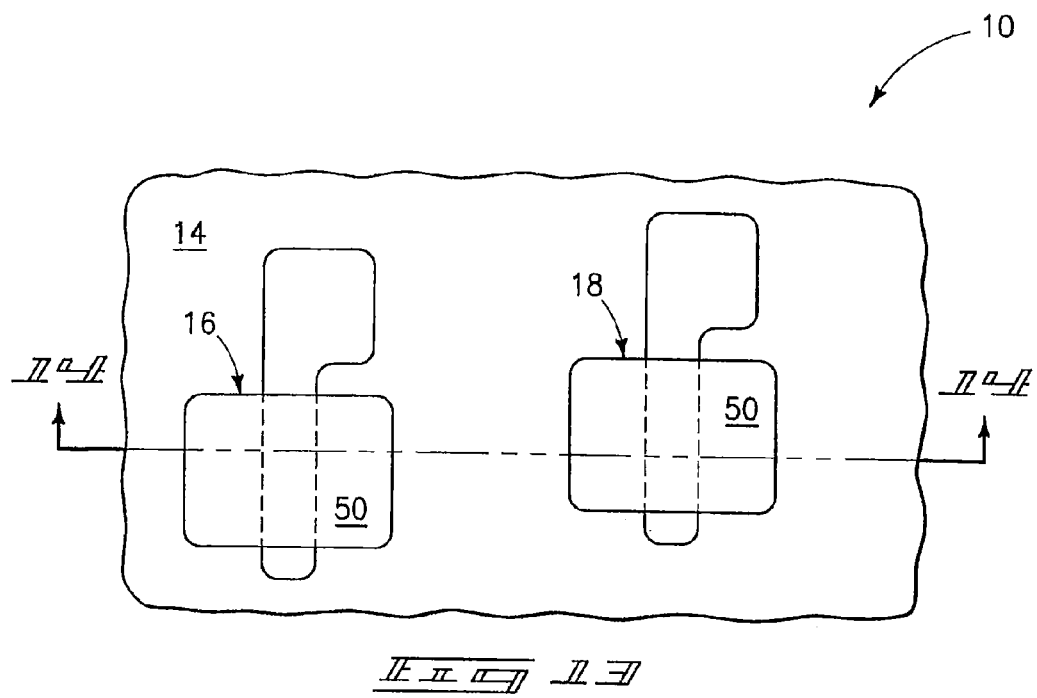
FIG. 13 is a view of the FIG. 11 substrate at a processing subsequent to that depicted by FIG. 11.
Figure 14:
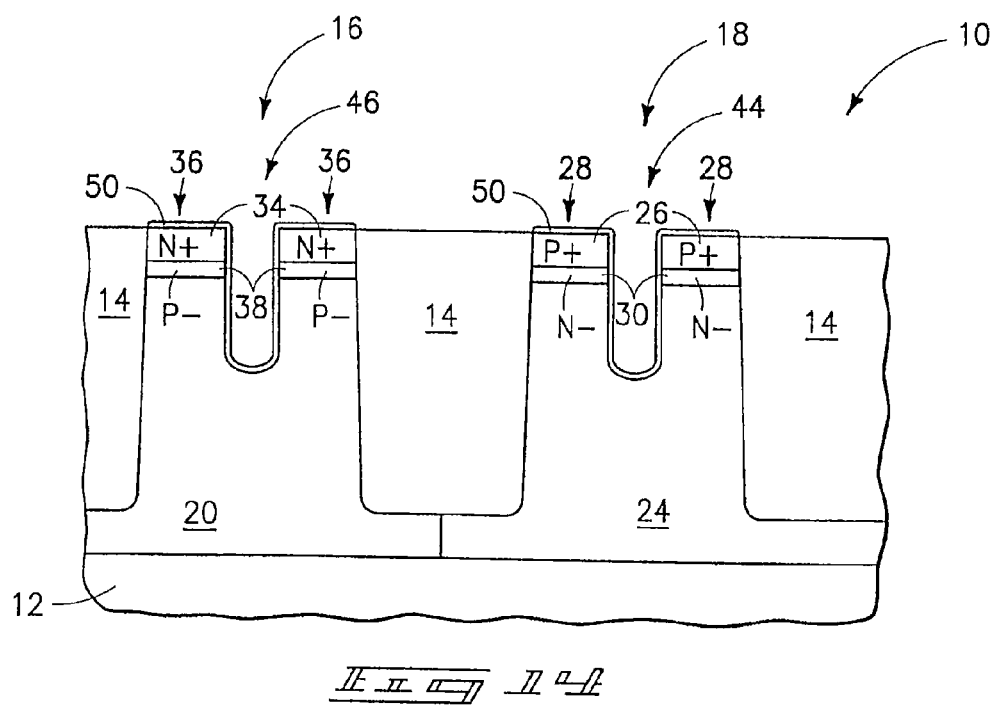
FIG. 14 is a view of the FIG. 13 substrate taken through line 14-14 in FIG. 13.

For example, FIGS. 13 and 14 depict forming a suitable gate dielectric 50 within first opening 44 and second opening 46. Such might comprise the same or different one or more materials for the respective transistors being fabricated, with examples including one or a combination of silicon dioxide, silicon nitride, aluminum oxide, hafnium oxide and zirconium oxide, and other preferred high-k dielectric materials. Also, different gate dielectric thickness can be provided if desired for the different p-channel and n-channel devices.

Figure 15:
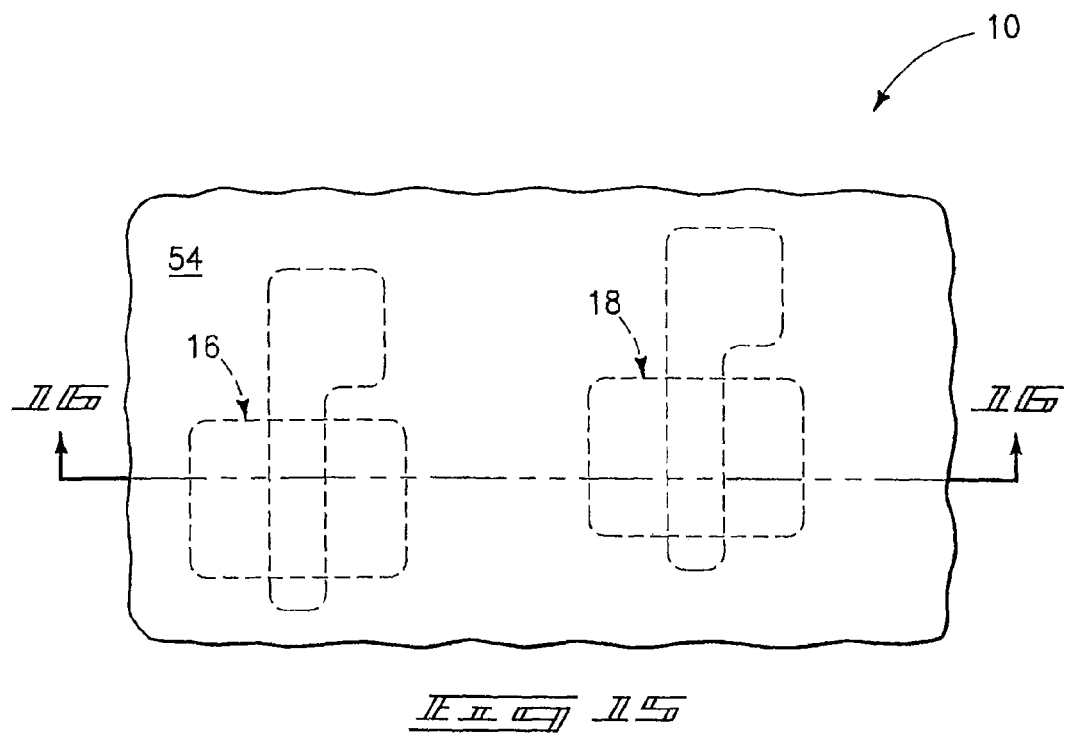
FIG. 15 is a view of the FIG. 13 substrate at a processing subsequent to that depicted by FIG. 13.
Figure 16:
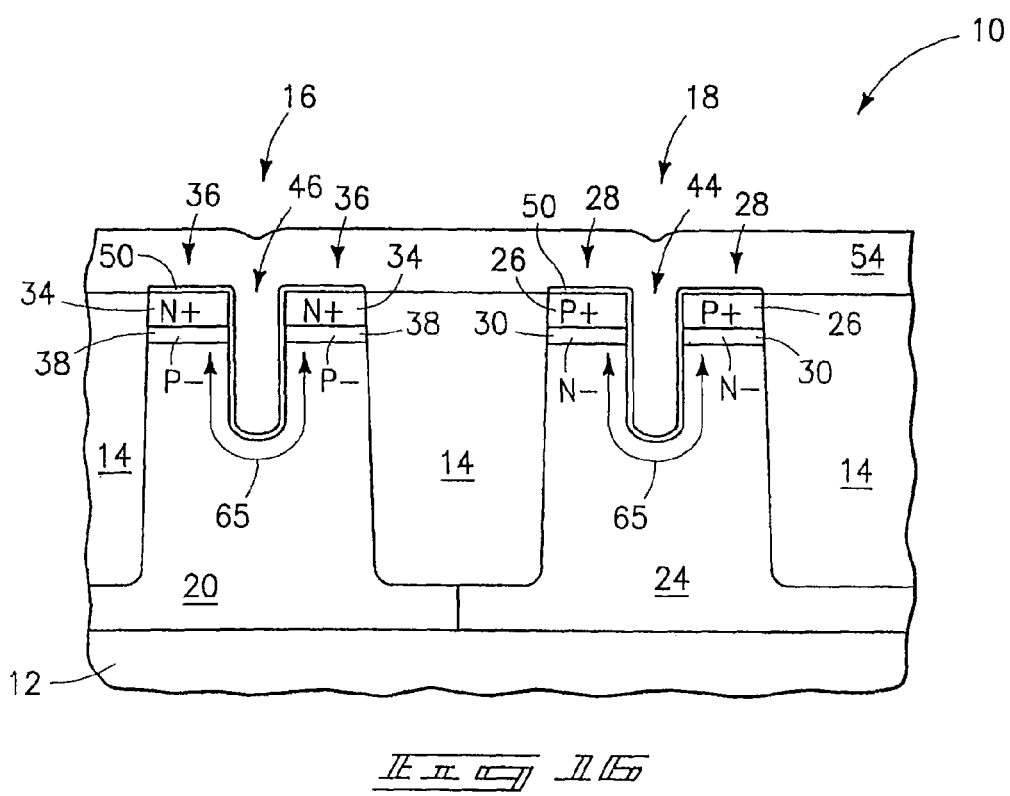
FIG. 16 is a view of the FIG. 15 substrate taken through line 16-16 in FIG. 15.

Referring to FIGS. 15 and 16, conductive material 54 of the transistor gate of the p-channel field effect transistor has been formed over gate dielectric 50 within first opening 44 and conductive material 54 of the transistor gate of the n-channel field effect transistor has been formed over gate dielectric 50 within second opening 46. The conductive material of the transistor gate of the p-channel field effect transistor and the conductive material of the transistor gate of the n-channel field effect transistor might be of the same or different compositions. Ideally, such are typically of at least slightly modified compositions for obtaining different and desired work functions for the respective p-channel and n-channel devices. Accordingly in such processing, separate depositions might occur relative to the material deposited to within openings 44 and 46, or a commonly deposited material 54 subjected to separate masked processings of such material within the respective openings 44 and 46.

Exemplary preferred conductive material from which conductive portions of the transistor gates are made include elemental-form metal (including alloys thereof), conductive metal compounds, and less preferably conductively doped semiconductive material (i.e., conductively doped polysilicon). Exemplary preferred materials include TaSiN for n-channel devices and TiN for p-channel devices. However of course, other elemental metals and metal compounds are contemplated.

Figure 17:
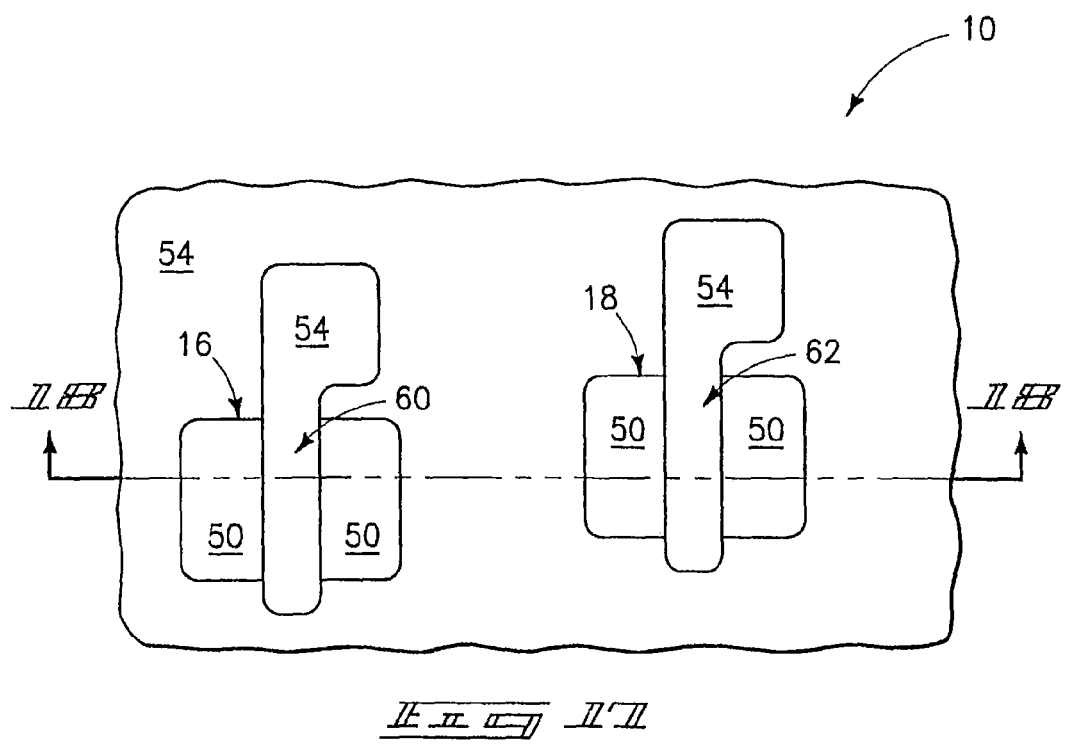
FIG. 17 is a view of the FIG. 15 substrate at a processing subsequent to that depicted by FIG. 15.
Figure 18:
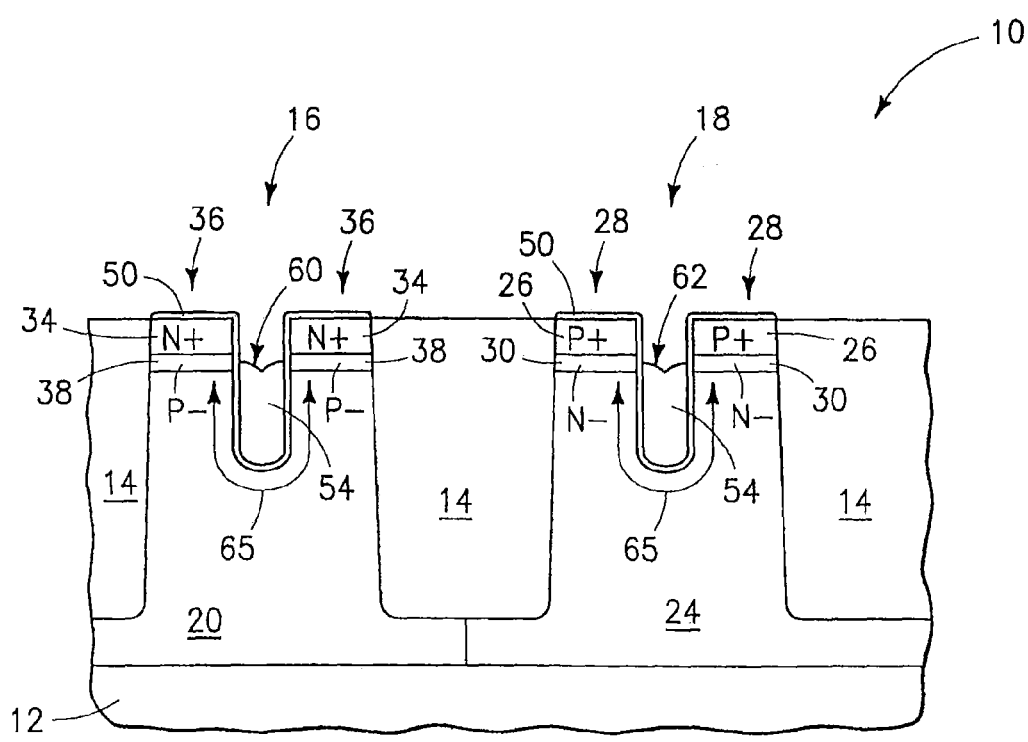
FIG. 18 is a view of the FIG. 17 substrate taken through line 18-18 in FIG. 17.

FIGS. 15 and 16 depict the formation of conductive material 54 as comprising a deposition which overfills openings 44 and 46. FIGS. 17 and 18 depict a preferred-embodiment subsequent removing of some of such deposited conductive material effective to recess material 54 to within openings 44 and 46. Such thereby forms an n-channel gate 60 and a p-channel gate 62. Each source/drain region 28 for the p-channel field effect transistor is comprised of an exemplary highest dopant concentration portion 26 and at least one lower dopant concentration portion 30, in the exemplary preferred embodiment. Likewise, each source/drain region 36 of the n-channel field effect transistor is comprised of a highest dopant concentration portion 34 and at least one lower dopant concentration portion 38. Arrows 65 depict the exemplary channels formed for current flow upon application of suitable voltage to the respective gates 60 and 62.

Figure 19:
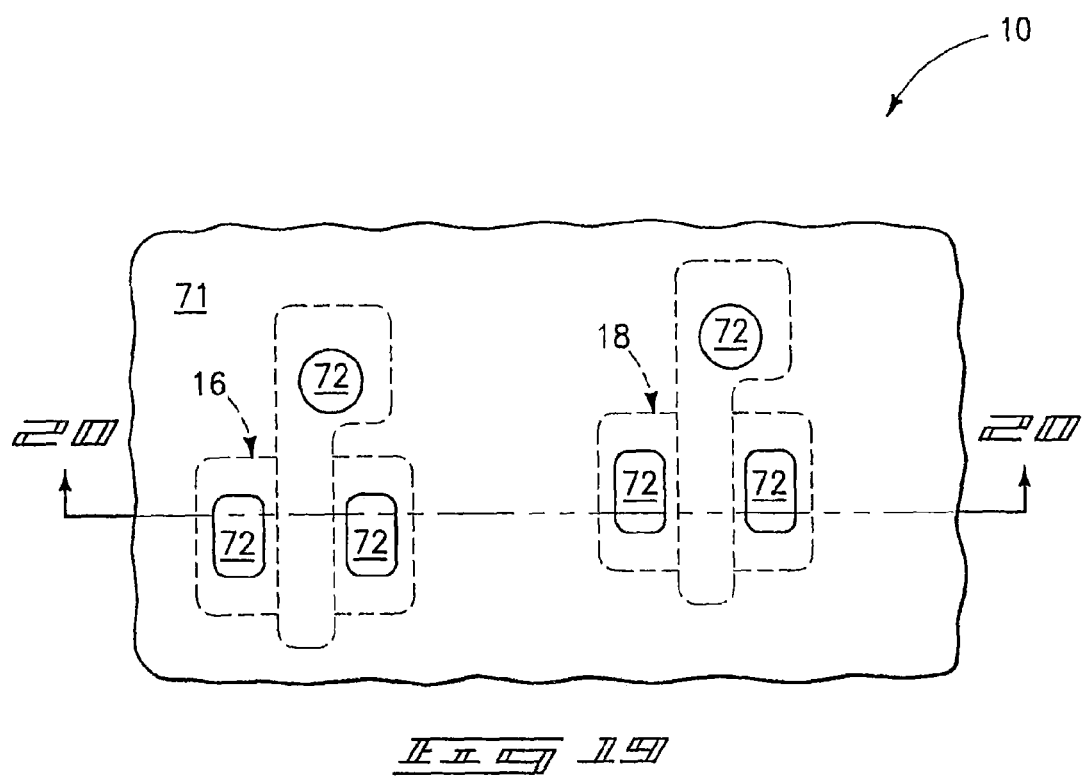
FIG. 19 is a view of the FIG. 17 substrate at a processing subsequent to that depicted by FIG. 17.
Figure 20:
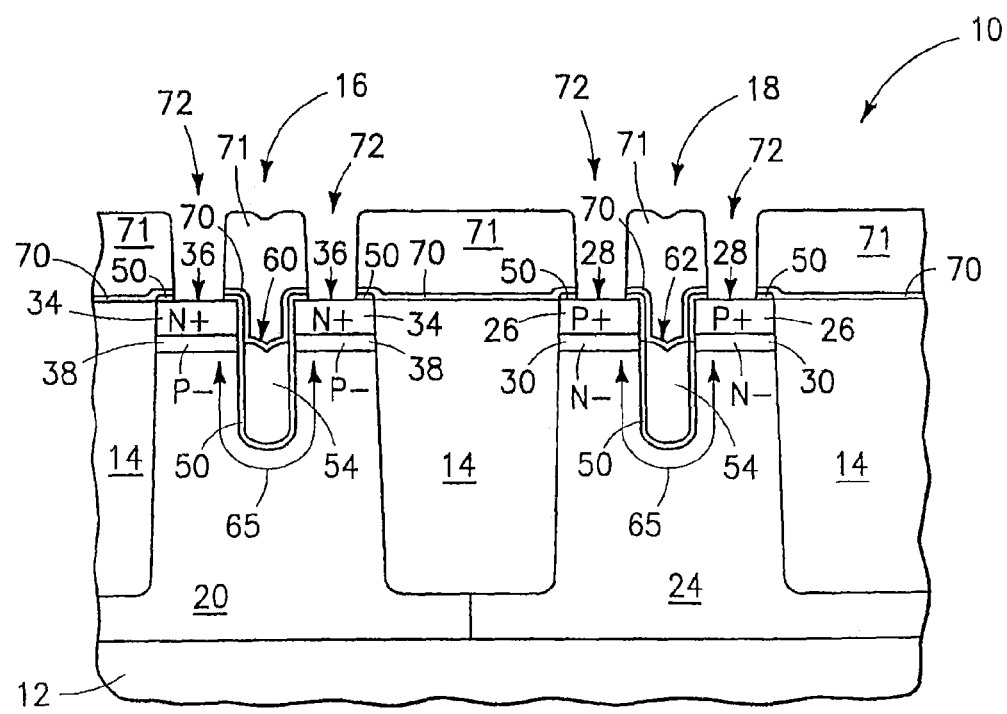
FIG. 20 is a view of the FIG. 19 substrate taken through line 20-20 in FIG. 19.

Referring to FIGS. 19 and 20, exemplary subsequent processing is depicted. Specifically, an insulative layer 70 (for example silicon nitride) has been deposited over the substrate. An exemplary thickness range for layer 70 is from 50 Angstroms to 200 Angstroms. A thicker, different composition, insulative material layer 71 (i.e., silicon dioxide deposited by the decomposition of tetraethylorthosilicate) has been formed over layer 70. An exemplary thickness range for layer 71 is from 1,000 Angstroms to 10,000 Angstroms. Contact openings 72 have been fabricated into and through layers 71 and 70 to provide the desired exposure to the respective source/drain regions and conductive material extending from the transistor gates. Suitable conductive contacts (not shown) would be formed thereto for the effective connection of such components with other conductive interconnects or devices (i.e., capacitors and/or conductive interconnect lines).

The above processing, by way of example only, depicts the semiconductive material of first region 26, the semiconductive material of second region 34, and the semiconductive material beneath such regions into which first opening 44 and into which second opening 46 are etched to each comprise bulk monocrystalline semiconductive material, for example bulk monocrystalline silicon. However, aspects of the invention also contemplate such semiconductive material as comprising other than bulk monocrystalline material, for example semiconductor-on-insulator substrates and material, and other substrates whether existing or yet-to-be developed.

Such exemplary preferred embodiments also depict the fabrication of the field effect transistor gate within an opening or trench formed within a semiconductor substrate such as bulk monocrystalline semiconductor material. However, the invention is in no way so limited. Aspects of the invention contemplate conducting a dopant activation anneal of a pair of source/drain regions prior to depositing material from which a conductive portion of the transistor gate is made regardless of the substrate or transistor orientation/structure. For example, and by way of example only, the field effect transistor gate could be formed outwardly of a bulk monocrystalline semiconductive material substrate, for example with respect to a conventional or yet-to-be developed horizontal/planar transistor, and wherein the pair of source/drain regions where subjected to a dopant activation anneal prior to the fabrication of a conductive portion of a transistor gate received operably between the source/drain regions over a channel region formed therebetween. Likewise, the invention contemplates conducting a dopant activation anneal of a pair of elevated source/drain regions of a horizontally-oriented field effect transistor, and for example regardless of whether such elevated source/drain regions are formed on or over bulk monocrystalline semiconductive material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor on a substrate, the field effect transistor comprising a pair of laterally spaced conductively doped source/drain regions, a channel region received intermediate and elevationally below the pair of source/drain regions, and a transistor gate received operably proximate the channel region, the method comprising:

ion implanting conductivity enhancing impurity dopant into semiconductive material of the substrate to form highest dopant concentration portions of the pair of source/drain regions, the highest dopant concentration portions comprising $1\times10^{13}$ to $1\times10^{16}$ ions/cm$^3$;

conducting a dopant activation anneal of the highest dopant concentration portions of the pair of source/drain regions, the semiconductive material having an exposed uppermost surface during the implanting and the anneal;

after the dopant activation anneal, etching an opening through the conductivity enhancing dopant into the semiconductive material of the substrate;

forming a gate dielectric that lines the entire sidewalls of the opening and directly overlies the uppermost surface of the semiconductive material; and depositing material from which a conductive portion of the transistor gate is made into the opening.

2. The method of claim 1 wherein the deposited material from which a conductive portion of the transistor gate is made comprises elemental-form metal.

3. The method of claim 1 wherein the deposited material from which a conductive portion of the transistor gate is made comprises a conductive metal compound.

4. The method of claim 1 wherein the deposited material from which a conductive portion of the transistor gate is made comprises conductively doped semiconductive material.

5. The method of claim 1 further comprising prior to conducting the dopant activation anneal, ion implanting conductivity modifying impurity dopant into semiconductive material of the substrate to form at least one lower dopant concentration portion proximate each highest dopant concentration portion.

6. The method of claim 5 wherein said lower dopant concentration portions are formed lower in the semiconductive material than are the highest dopant concentration portions.

7. The method of claim 5 wherein said lower dopant concentration portions are of the same conductivity type as the highest dopant concentration portions.

8. The method of claim 7 wherein the dopant of the lower dopant concentration portions and the dopant of the highest dopant concentration portions are of the same composition.

9. The method of claim 5 wherein said lower dopant concentration portions are of different conductivity type as compared to the highest dopant concentration portions.

10. The method of claim 1 wherein the pair of source/drain regions is formed within bulk monocrystalline semiconductive material of the substrate.

11. The method of claim 10 wherein the field effect transistor gate is formed outwardly of the bulk monocrystalline semiconductive material.

12. The method of claim 10 wherein the field effect transistor gate is formed within an opening formed within the bulk monocrystalline semiconductive material.

13. The method of claim 1 wherein the pair of source/drain regions comprises elevated source/drain regions of a horizontally oriented field effect transistor.

14. The method of claim 13 wherein the substrate comprises bulk monocrystalline semiconductive material, the elevated source/drain regions being formed on the bulk monocrystalline semiconductive material.

15. A method of forming a field effect transistor on a substrate, the field effect transistor comprising a pair of laterally spaced conductively doped source/drain regions, a channel region received intermediate and elevationally below the pair of source/drain regions, and a transistor gate received operably proximate the channel region, the method comprising:

ion implanting conductivity enhancing impurity dopant into an implant region of semiconductive material of the substrate to a highest dopant concentration for the pair of source/drain regions, the highest dopant concentration portions comprising $1\times10^{13}$ to $1\times10^{16}$ ions/cm$^3$;

after the ion implanting, conducting a dopant activation anneal of the implant region, an uppermost surface of the semiconductive material being exposed during the implanting and the anneal;

after the dopant activation anneal, etching an opening through the implant region into semiconductive material of the substrate;

forming gate dielectric material lining the entire sidewalls of the opening and directly on the uppermost surface of the semiconductive material; and forming conductive material of the transistor gate within the opening.

16. The method of claim 15 wherein the opening is laterally centered relative to the implant region in at least one straight line cross section of the substrate.

17. The method of claim 15 further comprising prior to conducting the dopant activation anneal, ion implanting conductivity modifying impurity dopant into semiconductive material of the substrate to form at least one lower dopant concentration portion below the implant region, the opening being etched through the portion.

18. The method of claim 15 wherein the forming of conductive material comprises depositing conductive material to overfill the opening.

19. The method of claim 18 further comprising removing some of the deposited conductive material effective to recess it within the opening.

20. A method of forming an n-channel field effect transistor and a p channel field effect transistor on a substrate, said transistors respectively comprising a pair of laterally spaced conductively doped source/drain regions, a channel region received intermediate and elevationally below the pair of source/drain regions, and a transistor gate received operably proximate the channel region, the method comprising:

ion implanting p-type conductivity enhancing impurity dopant into semiconductive material of the substrate to form highest dopant concentration portions of the pair of source/drain regions of the p-channel field effect transistor, the highest dopant concentration portions comprising $1\times10^{13}$ to $1\times10^{16}$ ions/cm$^3$;

ion implanting n-type conductivity enhancing impurity dopant into semiconductive material of the substrate to form highest dopant concentration portions of the pair of source/drain regions of the n-channel field effect transistor;

simultaneously conducting a dopant activation anneal of the highest dopant concentration portions of the pair of source/drain regions of each of the n-channel field effect transistor and of the p-channel field effect transistor, an uppermost surface of the semiconductive material being exposed during the implanting and the anneal; and after the dopant activation anneal, etching openings through the source/drain regions into the semiconductor material of the substrate;

forming gate oxide material lining an entirety of sidewalls of the openings and directly on the uppermost surface; and depositing material from which conductive portions of the transistor gates are made into the openings.

21. The method of claim 20 comprising depositing different conductive gate materials for the respective p-channel and n-channel field effect transistors.

22. The method of claim 20 comprising depositing the same conductive gate material for the respective p-channel and n-channel field effect transistors.

23. A method of forming an n-channel field effect transistor and a p channel field effect transistor on a substrate, said transistors respectively comprising a pair of laterally spaced conductively doped source/drain regions, a channel region received intermediate and elevationally below the pair of source/drain regions, and a transistor gate received operably proximate the channel region, the method comprising:

ion implanting p-type conductivity enhancing impurity dopant into a first region of semiconductive material of the substrate to a highest dopant concentration for the pair of source/drain regions of the p-channel field effect transistor, the highest dopant concentration portions comprising $1\times10^{13}$ to $1\times10^{16}$ ions/cm$^3$;

ion implanting n-type conductivity enhancing impurity dopant into a second region of semiconductive material of the substrate to a highest dopant concentration for the pair of source/drain regions of the n-channel field effect transistor;

simultaneously conducting a dopant activation anneal of the first and second regions, an uppermost surface of the semiconductive material being exposed during the implanting and the anneal;

after the dopant activation anneal, etching a first opening through the first region into semiconductive material of the substrate and etching a second opening through the second region into semiconductive material of the substrate;

forming gate dielectric lining entire sidewalls within the first and second openings and on the uppermost surface of the semiconductive material; and forming conductive material of the transistor gate of the p-channel field effect transistor over the gate dielectric within the first opening and conductive material of the transistor gate of the n-channel field effect transistor over the gate dielectric within the second opening.

24. The method of claim 23 further comprising prior to conducting the dopant activation anneal, ion implanting conductivity modifying impurity dopant into semiconductive material of the substrate to form at least one lower dopant concentration portion below each of the first and second regions, the first opening being etched through said lower dopant concentration portion received beneath first region, the second opening being etched through said lower dopant concentration portion received beneath second region.

25. The method of claim 23 wherein the semiconductive material of the first region, the semiconductive material of the second region, the semiconductive material into which the first opening is etched and the semiconductive material into which the second opening is etched comprise bulk monocrystalline semiconductive material.

\* \* \* \* \*